(12) United States Patent
Shih et al.

(10) Patent No.: US 8,012,815 B2
(45) Date of Patent: Sep. 6, 2011

(54) ARRAY SUBSTRATE AND METHOD FOR FABRICATING THEREOF

(75) Inventors: Chih-Hung Shih, Luodong Township, Yilan County (TW); Ming-Yuan Huang, Jhonghe (TW); Chih-Chun Yang, Jhubei (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/837,787

(22) Filed: Jul. 16, 2010

(65) Prior Publication Data
US 2010/0285623 A1 Nov. 11, 2010

Related U.S. Application Data

(62) Division of application No. 11/625,359, filed on Jan. 22, 2007, now Pat. No. 7,781,766.

(30) Foreign Application Priority Data

Jul. 20, 2006 (TW) ................................ 95126510 A

(51) Int. Cl.
*H01L 21/84* (2006.01)

(52) U.S. Cl. ................................ 438/155; 257/E21.158
(58) Field of Classification Search .................. 438/155, 438/159
See application file for complete search history.

(56) References Cited

U.S. PATENT DOCUMENTS

| | | | |
|---|---|---|---|
| 5,959,312 A | 9/1999 | Tsai et al. | |
| 6,303,946 B1 * | 10/2001 | Sung ...................... | 257/E21.414 |
| 6,335,276 B1 | 1/2002 | Park et al. | |
| 6,933,208 B2 | 8/2005 | Yanagisawa et al. | |
| 7,335,919 B2 * | 2/2008 | Koo et al. ...................... | 257/40 |
| 2003/0213966 A1 | 11/2003 | Yang et al. | |

* cited by examiner

*Primary Examiner* — Chandra Chaudhari
(74) *Attorney, Agent, or Firm* — Thomas|Kayden

(57) ABSTRACT

The invention provides a method for manufacturing an array substrate utilizing a laser ablation process. A conductive layer can be selectively patterned by the laser ablation process without a photo mask due to different adhesions between the conductive layer and other materials. The patterned conductive layer thus formed adjoins an inorganic passivation layer to provide a substantially continuous surface.

16 Claims, 13 Drawing Sheets

_US 8,012,815 B2_

ARRAY SUBSTRATE AND METHOD FOR FABRICATING THEREOF

CROSS REFERENCE TO RELATED APPLICATIONS

This is a divisional of U.S. application Ser. No. 11/625,359, filed Jan. 22, 2007, entitled "Array Substrate and Method for Fabricating Thereof," now U.S. Pat. No. 7,781,766, which claims priority to Republic of China (Taiwan) application number 95126510, filed Jul. 20, 2006, both of which are incorporated herein by reference.

BACKGROUND OF THE INVENTION

1. Field of the Invention

The invention relates to an array substrate and a fabrication method thereof, and more particularly, to use of a laser ablation process to manufacture the array substrate.

2. Description of the Related Art

LCD operation, in which angles of liquid crystal molecules are changed to control light transmission, conventionally requires a liquid crystal layer disposed between a color filter substrate and a thin film transistor (TFT) array substrate. As shown in FIGS. 1A-1E, TFT array substrate fabrication comprises five photo mask processes. The substrate is defined to two areas, with area I serving to form a TFT and area II serving a storage capacitor. FIG. 1A shows a metal layer formed on the substrate 10 and patterned by a first photo mask, thereby forming a gate electrode 11A in area I and a bottom electrode 11B in area II, respectively. As shown in FIG. 1B, a dielectric layer 12, a semiconductor layer, and a doped semiconductor layer are sequentially formed on the structure and patterned by a second photo mask, thereby forming a channel layer 13 and an ohmic contact layer 14 in area I. As shown in FIG. 1C, a metal layer is formed and patterned by a third photo mask to form source/drain electrodes 15. The channel layer 13 and ohmic contact layer 14 not masked by the source/drain electrodes 15 are etched simultaneously. As shown in FIG. 1D, a passivation layer 17 is formed and patterned by a fourth photo mask to form a contact hole 16 to expose the part of the drain electrode 15 of the TFT. A conductive layer is formed overlying the structure and patterned by a fifth photo mask. As shown in FIG. 1E, the patterned conductive layer 18 serves as a top electrode in area II and pixel electrode electrically connects to the drain electrode 15 through the contact hole 16.

In addition to the lithography process, organic or inorganic material layers can be patterned by laser ablation such as disclosed in U.S. Pat. No. 6,933,208 B2. Because the laser ablation cannot selectively pattern, it is necessary to use a photo mask, thereby raising costs. Compared to other lithography light sources, large area exposure is difficult in laser source. The photo mask alignment also complicates the machine integration. Accordingly, a selective laser ablation process without requiring a photo mask is called for.

BRIEF SUMMARY OF THE INVENTION

A detailed description is given in the following embodiments with reference to the accompanying drawings.

The present invention provides a laser ablation process without a photo mask to selectively pattern a conductive layer, thereby reducing the fabrication cost of the TFT array substrate of the LCD.

The present invention provides a method for manufacturing an array substrate, comprising forming a contact pad, a thin film transistor (TFT), a pixel region, and a storage capacitor on a substrate, forming an organic material layer on the contact pad, the TFT, the pixel region, and the storage capacitor, patterning the organic material layer to expose the pixel region, the part of the contact pad, the part of the TFT, and the part of the storage capacitor, depositing a conductive layer on the exposed pixel region, the exposed the part of the contact pad, the exposed the part of the TFT, and exposed the part of the storage capacitor, and applying a laser ablation process to remove the conductive layer on the organic material layer so that the conductive layer remains on the pixel region, on the part of the contact pad, on the part of the TFT, and on the part of the storage capacitor.

The present invention also provides an array substrate, comprising a contact pad, a thin film transistor (TFT), a pixel region, and a storage capacitor formed on a substrate, respectively, an inorganic passivation layer formed on the part of the contact pad, the TFT, the pixel region, and the storage capacitor, and a conductive layer formed on the part of the contact pad, the part of the TFT, the part of the storage capacitor, and the pixel region, wherein the inorganic passivation layer adjoins the conductive layer to form a substantially continuous surface.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The following description is of the best-contemplated mode of carrying out the invention. This description is made for the purpose of illustrating the general principles of the present invention and should not be taken in a limiting sense. The scope of the present invention is best determined by reference to the appended claims.

Figure 1A:
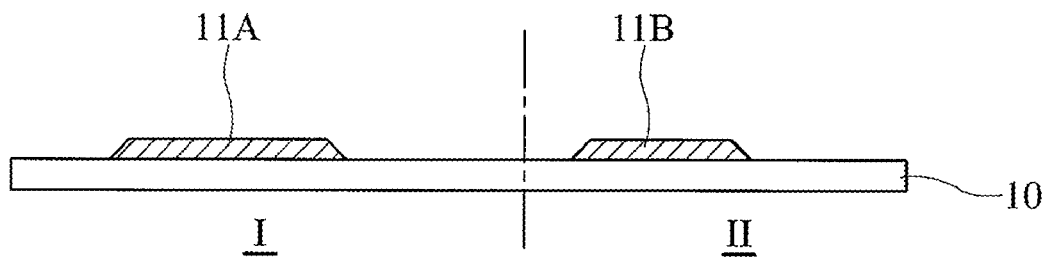
FIGS. 1A-1E are serial cross sectional views of processes in conventional TFT array substrate fabrication.
Figure 1B:
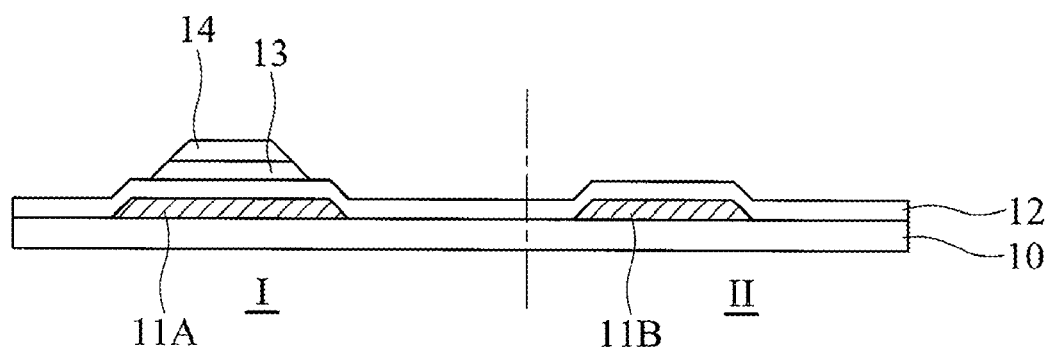
Figure 1C:
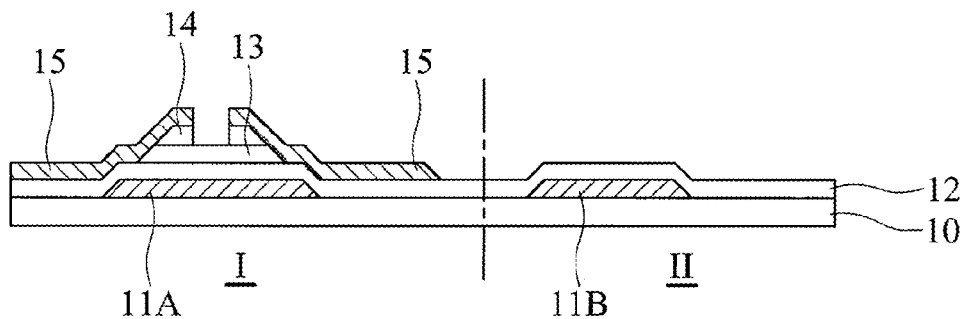
Figure 1D:
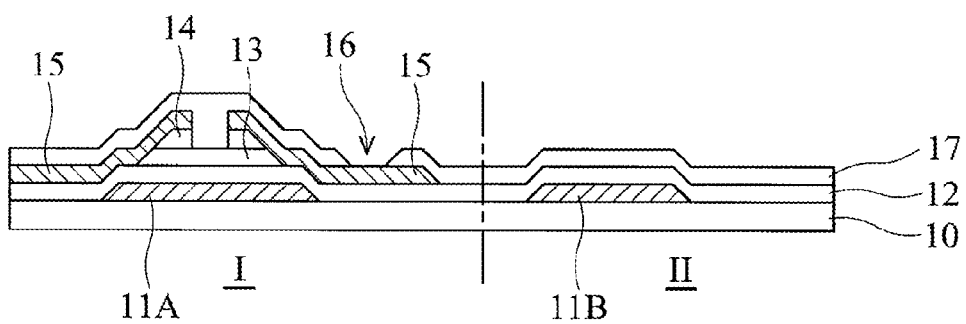
Figure 1E:
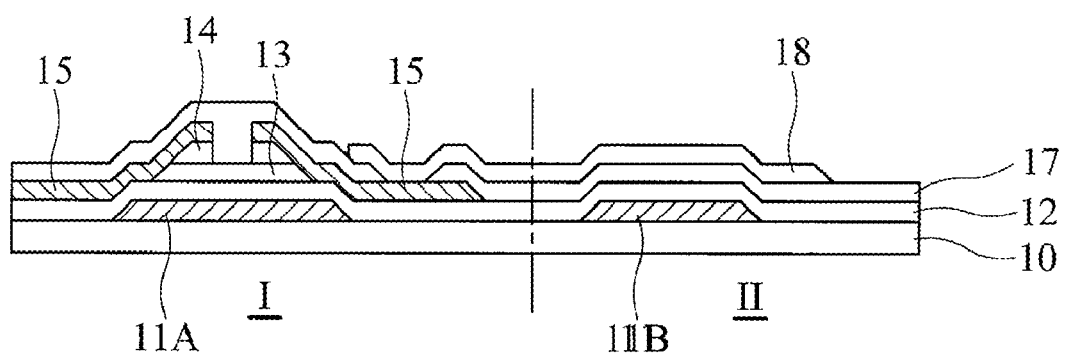
Figure 2A:
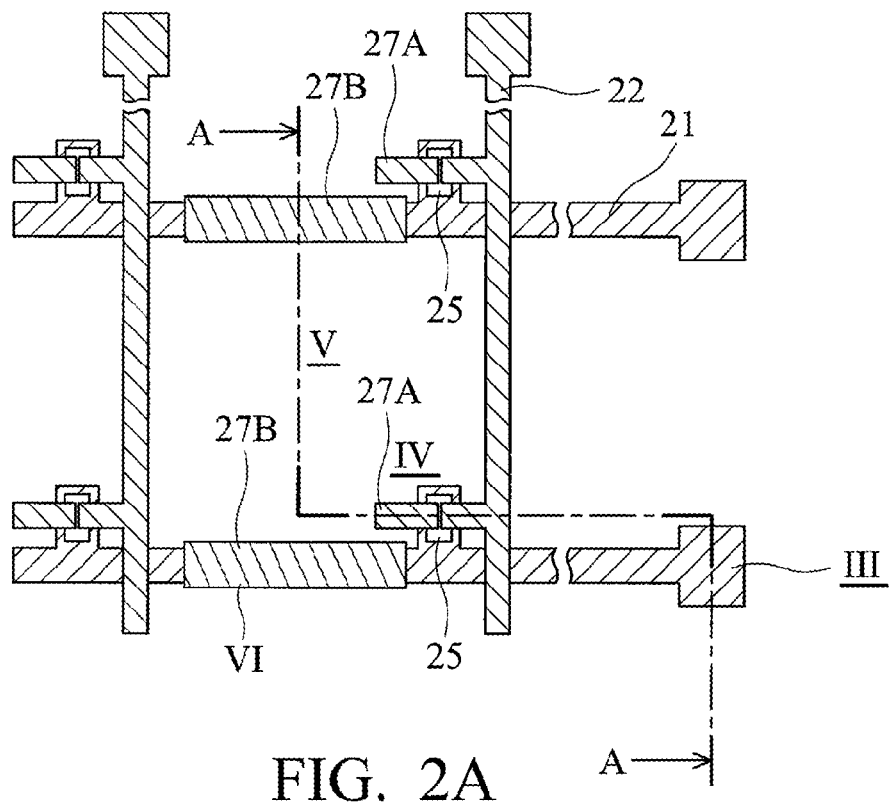
FIGS. 2A-2E are serial cross sectional views of the processes in an embodiment of the present invention.

FIG. 2A is a top view of an array substrate of an embodiment of the present invention. Gate lines 21 cross data lines 22 to form the pixel region V with at least one thin film transistor (TFT) IV to control an orientation of the liquid crystal molecules. The terminals of the gate lines 21 and data lines 22 are contact pads III, and a top electrode is formed overlying the part of the gate lines 21 to form a storage capacitor VI. While one TFT is charted in the pixel region V of FIG. 2A, the pixel region V may contain one or more TFT or other kind of TFT such as a TFT for controlling storage capacitor, a TFT for controlling current flow, other TFT, or combinations thereof.

Figure 2B:
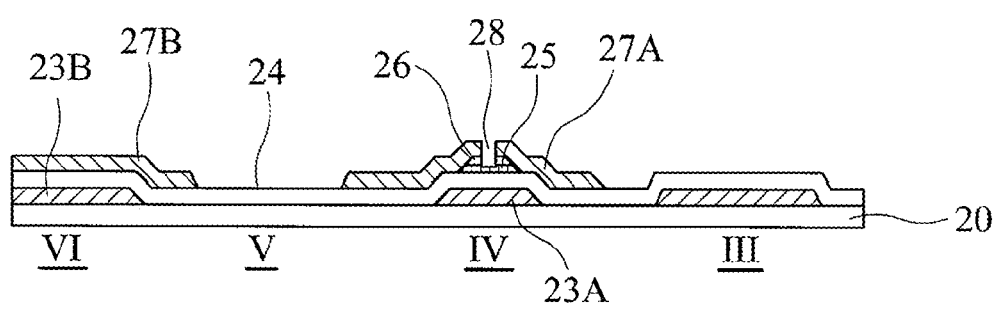

FIG. 2B is a cross sectional view taken along A-A dotted line in FIG. 2A. III is a contact pad in gate line terminal, IV refers to a TFT, V refers to a pixel region, and VI refers to a storage capacitor. First, a metal layer is formed on the substrate 20, and patterned to expose the substrate 20 in the pixel region V. The substrate material is generally transparent material (such as glass, quartz, or likes), opaque material (such as silicon base, ceramic, or likes), or flexible material (such as plastic, rubber, polyester, polycarbonate, or likes). The metal layer can be molybdenum (Mo), aluminum (Al), neodymium (Nd), copper (Cu), golden (Au), chromium (Cr), silver (Ag), ferrum (Fe), tin, titanium (Ti), tantalum (Ta), nitride compound including metal, oxide compound including metal, oxy-nitride compound including metal, alloy, or a multi-layered structure thereof, preferably a Mo/AlNd alloy. The metal layer is patterned to form the contact pad III, the gate electrode 23A of the TFT IV, the gate lines 21, and the bottom electrode 23B of the storage capacitor VI. A dielectric layer 24 is sequentially formed on the patterned metal layer 23 and the exposed part of the substrate 20. The dielectric layer 24 serves as a gate dielectric layer of the TFT IV and a capacitance dielectric layer of the storage capacitor VI. The dielectric layer can be an organic material (such as organo-silicone, photo-resist, or likes), an inorganic material (such as silicon nitride, silicon oxide, silicon oxynitride, silicon carbide), or combinations thereof. A channel layer 25 and an ohmic contact layer 26 are formed and patterned on the dielectric layer 24. The channel layer 25 includes amorphous silicon, polysilicon, microcrystalline silicon, single crystalline silicon, or combinations thereof. The channel layer 25 can be formed by chemical vapor deposition (CVD), plasma enhanced CVD (PECVD), rapid thermal CVD (RTCVD), ultra high vacuum CVD (UHVCVD), or molecular beam epitaxy (MBE). The ohmic contact layer 26 is doped silicon, optionally selecting a n-type, p-type dopant, or combinations thereof.

A metal layer is formed by sputtering or other physical vapor deposition. Suitable metal layer is molybdenum (Mo), aluminum (Al), chromium (Cr), neodymium (Nd), copper (Cu), golden (Au), silver (Ag), ferrum (Fe), tin, titanium (Ti), tantalum (Ta), nitride compound including metal, oxide compound including metal, oxy-nitride compound including metal, alloy, or multi layer structure thereof, preferably a multi layer structure such as Mo/Al/Mo. The metal layer patterned to act as source/drain electrodes 27A of the TFT IV, the top electrode 27B of the storage capacitor VI, and data lines 22. The opening 28 is formed simultaneously to expose the part of the channel layer 25. This patterning step such as lithography and etching removes the part of the metal layer to form source/drain electrodes 27A, and remove the part of the ohmic contact layer 26 to expose the part of the channel layer 25. Referring to FIG. 2A, the data lines 22 electrically connect to drain electrode 27A. Gate lines 21, data lines 22, contact pad III, TFT IV, pixel region V, and storage capacitor VI are formed on the substrate 20. As shown in FIG. 2B, the storage capacitor VI comprises dielectric layer 24 between the top electrode 27B and the bottom electrode 23B. The TFT IV comprises gate electrode 23A, the dielectric layer 24, the channel layer 25, the ohmic contact layer 26, and source/drain electrodes 27A. The contact pad III has the material similar to the material of the gate electrode 23A and the bottom electrode 23B.

Figure 3A:
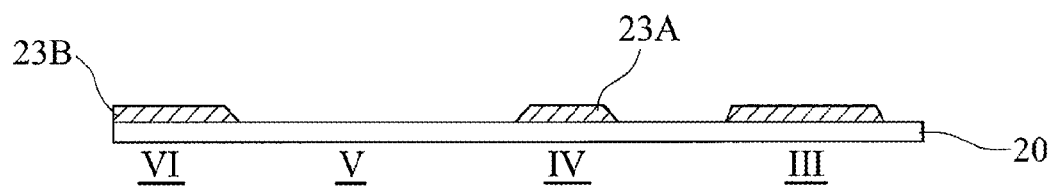
FIGS. 3A-3H are serial cross sectional views of the processes in an embodiment of the present invention.
Figure 3B:
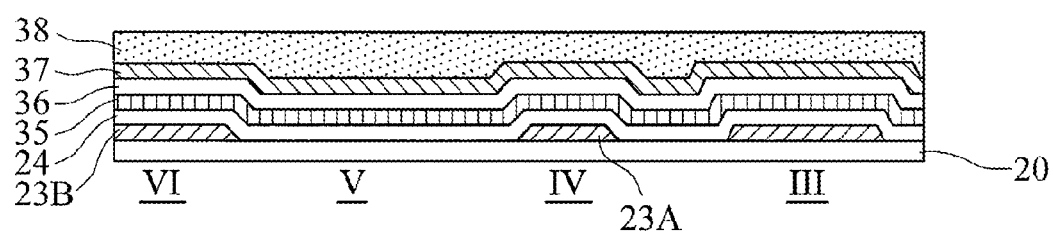

Fabrication of the array substrate in FIG. 2A is not limited to the process disclosed, and other methods such as those shown in FIGS. 3A-3F may be used, wherein similar symbols represent similar elements in FIG. 2A for convenience. A metal layer is formed on the substrate 20 and patterned to expose the substrate 20 of the pixel region V, further to form the contact pad III, the gate electrode 23A of the TFT IV, the gate lines 21, and the bottom electrode 23B of the storage capacitor VI. Composition and fabrication of the metal layer are similar to those in FIG. 2B. Next as shown in FIG. 3B, the dielectric layer 24, the channel layer 35, the ohmic layer 36, the metal layer 37, and the photoresist layer 38 are sequentially formed on the patterned metal layer and the exposed substrate. Composition and fabrication of the multi layer structure are similar to those in FIG. 2B.

Figure 3C:
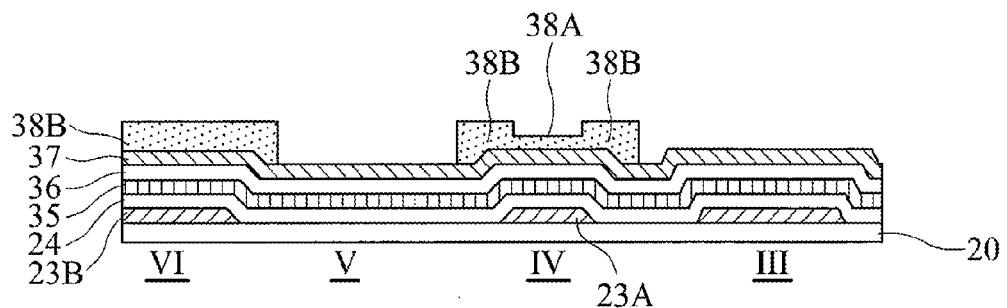

As shown in FIG. 3C, the photoresist layer 38 is patterned by a lithography process to form photoresist regions 38A and 38B with different thicknesses. The photo mask of the lithography process may be half-tone, gray-level, slit-pattern, diffractive, or likes. The thin photoresist region 38A is formed substantially corresponding to the predetermined channel region. The thick photoresist region 38B is formed substantially corresponding to the predetermined data lines 22, top electrode of the storage capacitor VI, and source/drain electrodes of the TFT IV. In other words, the thin photoresist region 38A substantially aligns with the predetermined channel region, and the thick photoresist region 38B substantially aligns with the predetermined data lines 22, the top electrode of the storage capacitor VI, and the source/drain electrodes of the TFT IV. However, the other part of the photoresist layer 38, such as the part of the photoresist layer 38 on the pixel region V and the contact pad III is removed.

Figure 3D:
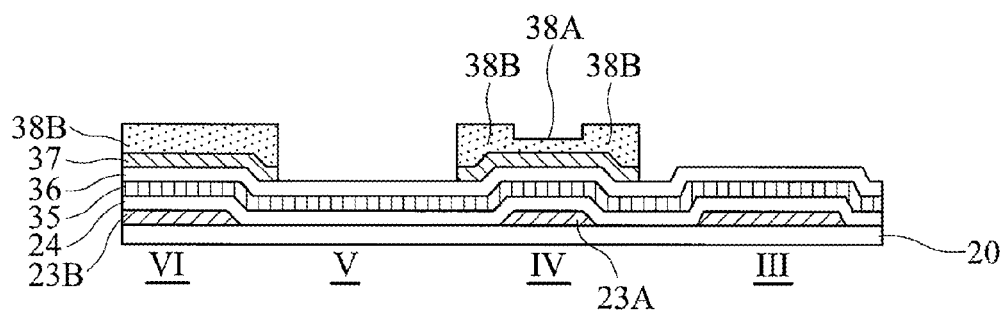
Figure 3E:
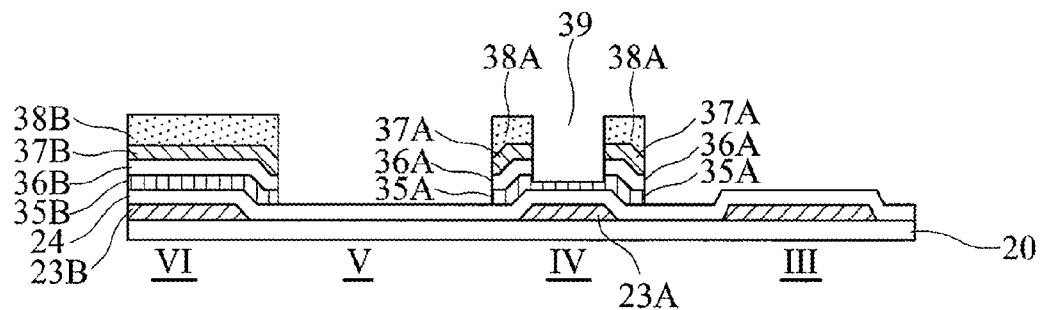

As shown in FIG. 3D, the part of the exposed metal layer 37 in the pixel region V and the part of the contact pad III are etched. This etching step defines the top electrode 37 B and the part of the exposed ohmic contact layer 36. Next as shown in FIG. 3E, a plasma treating is performed to remove the thin photoresist region 38A and expose the metal layer 37 on the channel layer. Note that the plasma treating removes not only the thin photoresist region 38A but also the part of the thick photoresist region 38B, thereby shrinking the thickness and the width of the thick photoresist region 38B. Then, the part of the metal layer 37 on the channel region, the part of the exposed ohmic contact layer 36, and the part of the exposed channel layer 35 are etched and removed. Simultaneously, the other part layers non-covered by the thick photoresist region 38B are removed, such as parts of the ohmic contact layer 36 and channel layer 35 non-covered by the thick photoresist region 38B are removed. Referring to FIG. 3D, the metal layer 37 is retained on the channel region of the TFT IV other than the exposed region, such as on the contact pad III and the pixel region V. When the channel layer 35 and the ohmic contact layer 36 of the contact pad III and the pixel region III are etched, only the metal layer 37 and the ohmic contact layer 36 of the TFT IV are etched, such that the part of the channel layer 35A of the TFT IV is selectively retained. Thus, top electrode 37B of the storage capacitor IV, source/drain electrodes 37A of the TFT IV, the ohmic contact layers 36A and 36B, channel layers 35A and 35B, and the opening 39 are defined.

The structure in FIG. 3E can be formed by other methods as follows. The part of the metal layer 37, the part of the ohmic contact layer 36, and the part of the channel layer 35 non-covered by the thin and thick photoresist region 38A and 38B can be pre-etched to expose the part of the dielectric layer 24. After performing a plasma treating to remove thin photoresist region 38A, and the metal layer 37 on the channel region is exposed. The metal layer 37 on the channel region, the part of the exposed ohmic contact layer 36, and the part of the exposed channel layer 35A are sequentially etched.

Figure 2C:
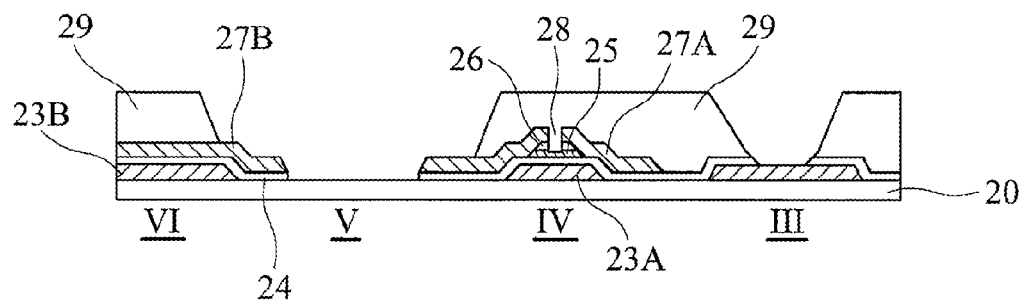
Figure 2D:
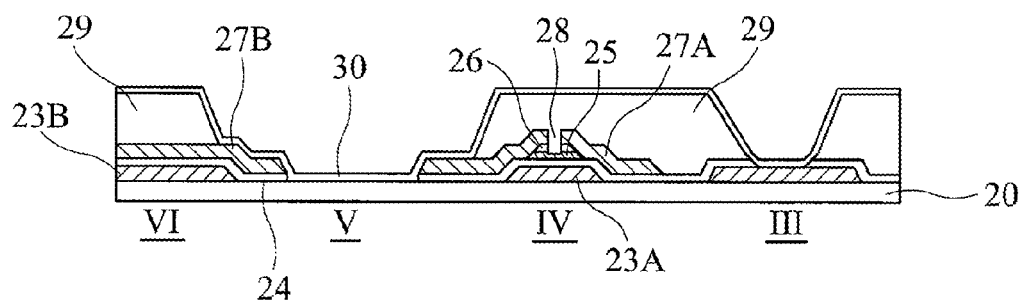
Figure 2E:
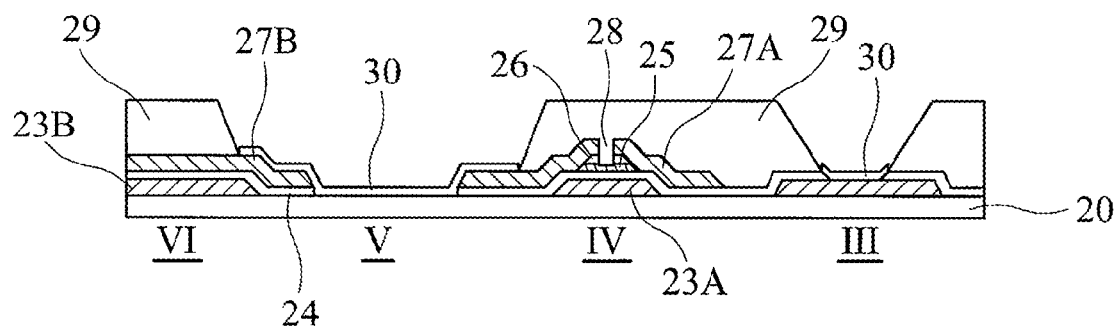
Figure 3F:
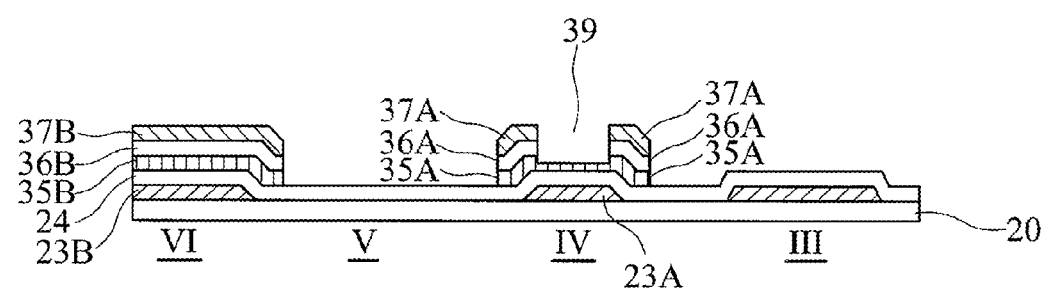

As shown in FIG. 3F, the thick photoresist region 38B is removed. The storage capacitor VI includes the dielectric layer 24, the channel layer 35B, and the ohmic contact layer 36B disposed between the top electrode 37B and the bottom electrode 23B. The TFT IV including the gate electrode 23A, the dielectric layer 24, the channel layer 35A, the ohmic contact layer 36A, and the source/drain electrodes 37A. The contact pad III has similar composition to the gate electrode 23A and the bottom electrode 23B. Unlike the process in FIG. 2B, the metal layer 27 is here formed after patterning the ohmic contact layer 26 and the channel layer 25 with a photo mask. The process in FIGS. 3A-3F forms the channel layer 35, the ohmic contact layer 36, the metal layer 37, and the photoresist layer 38, however, and forms the photoresist regions 38A and 38B with different thickness by a half-tone photo mask, thereby further patterning the multi layer structure. The process in FIG. 3F saves one photo mask compared to that in FIG. 2B. Subsequent processes are similar to those in FIGS. 2C-2E and 4A-4D.

As shown in FIG. 2C, an organic passivation layer 29 is formed and patterned to expose the part of the contact pad III, the part of the source electrode 27A, the substrate 20 of the pixel region V, and the part of the top electrode 27B of the storage capacitor VI. The organic passivation layer 29 can be a positive photoresist or a negative photoresist.

As shown in FIG. 2D, a conductive layer 30 is formed overlying the structure in FIG. 2C. If the LCD is transmissive type, the conductive layer 30 is preferably a transparent material such as indium tin oxide (ITO), indium zinc oxide (IZO), aluminum zinc oxide (AZO), or combinations thereof. If the LCD is reflective type, the conductive layer 30 can be an opaque material such as Mo, Cr, Ag, Cu, Au, Fe, Nd, Al, Ti, Ta, Nd, nitride compound including metal, oxide compound including metal, oxy-nitride compound including metal, alloy, or combinations thereof. If the LCD is transflective, the transparent material is adopted in transmission regions and the opaque material is adopted in reflective regions, respectively.

The structure in FIG. 2E is completed by directly performing a laser ablation process. The surface molecular bonding of the material or internal molecular bonding of the material is broken by the laser energy due to photochemical reaction or thermal exciting. The conductive layer 30 has stronger adhesion to flexible material, inorganic material, metal, or alloy, but the conductive layer 30 has weaker adhesion to the organic passivation layer 29. Therefore the laser ablation process selectively removes the conductive layer 30 from the organic passivation layer 29, and retains the part of the conductive layer 30 non-covering the organic passivation layer 29, such as the conductive layer 30 on the part of the exposed contact pad III, on the part of the source electrode 27A of the TFT IV, on the substrate 20 of the pixel region V, and on the part of the top electrode 27B of the storage capacitor VI is retained. An array substrate of the present invention is accomplished after the laser ablation process.

Figure 3G:
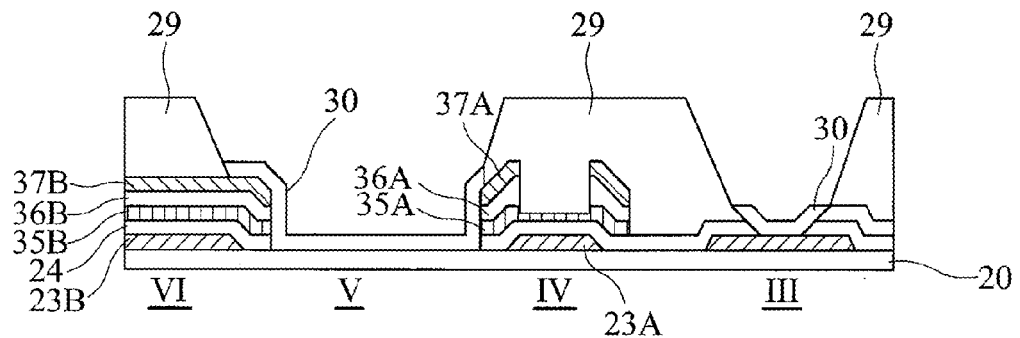

FIG. 3G shows the structure resulting from the processes of FIGS. 2C-2E following FIG. 3F. The laser ablation process and composition/fabrication method of the organic passivation layer 29 and the conductive layer 30 is omitted due to its similarity to that shown to FIGS. 2C-2E.

Note that the composition of the conductive layer influences the choice of wavelength and energy of the laser. For example, the laser used to ablate ITO has a wavelength of substantially 150 nm to 400 nm, preferably of about 200 nm to about 400 nm, such as KrF laser (248 nm); and this laser has an energy density of substantially 10 mJ/cm$^2$ to 500 mJ/cm$^2$, preferably of about 80 mJ/cm$^2$ to about 160 mJ/cm$^2$. The conductive layer of the present invention is not limited to ITO, and any appropriate conductive layer and corresponding laser type, wavelength, and energy can be chosen. The choice should adopt to selectively ablate the conductive layer on the organic passivation layer 29 and retain the conductive layer on at least one of the flexible material, organic material, inorganic material, metal, alloy, or combinations thereof.

Figure 4A:
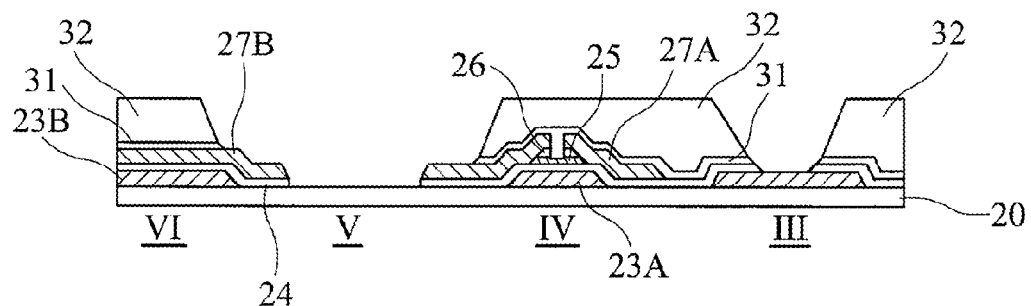
FIGS. 4A-4D are serial cross sectional views of the processes in an embodiment of the present invention.

FIGS. 4A-4D show another embodiment of the present invention. FIG. 4A shows process subsequent to the structure in FIG. 2B. The difference between FIG. 4A and FIG. 2C is replacement of the organic passivation layer 29 with a conformably inorganic passivation layer 31. As shown in FIG. 4A, the inorganic passivation layer 31 and a photoresist layer 32 are sequentially formed, and the photoresist layer 32 undergoes lithography to expose the part of the inorganic passivation layer 31. Using the retained photoresist later 32 as a mask, the exposed inorganic passivation layer 31 is etched to expose the part of the contact pad III, the part of the source electrode 27A of the TFT IV, the substrate 20 of the pixel region V, and the part of the top electrode 27B of the storage capacitor VI. Preferably, the inorganic passivation layer 31 is formed by CVD or PECVD, and includes silicon nitride, silicon oxide, silicon oxynitride, silicon carbide, or combinations thereof. The photoresist 32 can be formed by spin-on coating method.

Figure 4B:
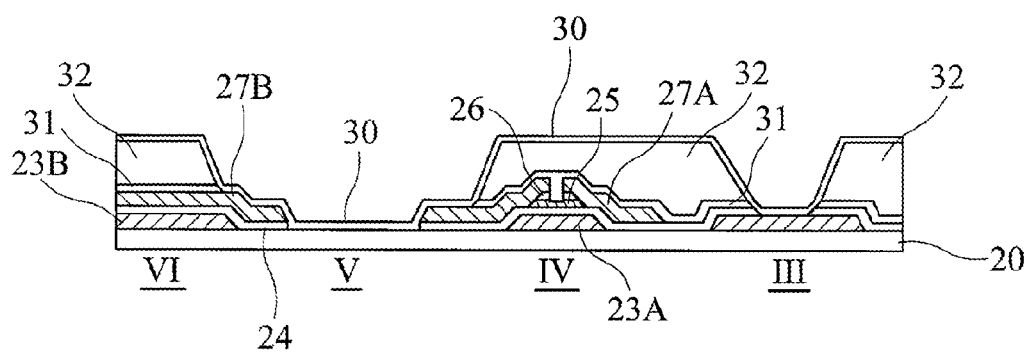
Figure 4C:
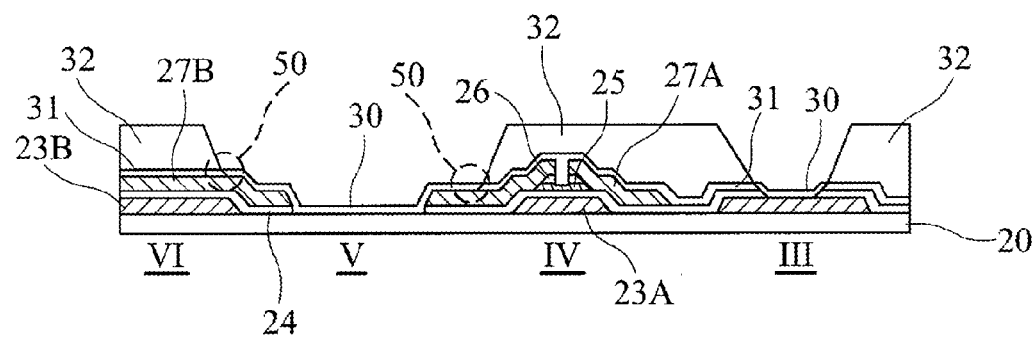

As shown in FIG. 4B, a conductive layer 30 is formed on the structure in FIG. 4A. Similar to the above-mentioned embodiment, the conductive layer may be transparent, opaque, or combinations thereof. After a laser ablation process, the structure in FIG. 4C is achieved. Like the laser ablation process in FIG. 2E, the conductive layer 30 has stronger adhesion to flexible material, inorganic material, metal, alloy, or combinations thereof, but the conductive layer 30 has weaker adhesion to the photoresist layer 32. Accordingly, the conductive layer 30 on the photoresist layer 32 is selectively ablated, and the part of the conductive layer 30 non-covering the organic passivation layer 29, such as the conductive layer on the part of the exposed contact pad III, on the part of the source electrode 27A of the TFT IV, on the substrate 20 of the pixel region V, and on the part of the top electrode 27B of the storage capacitor VI, is retained.

Figure 4D:
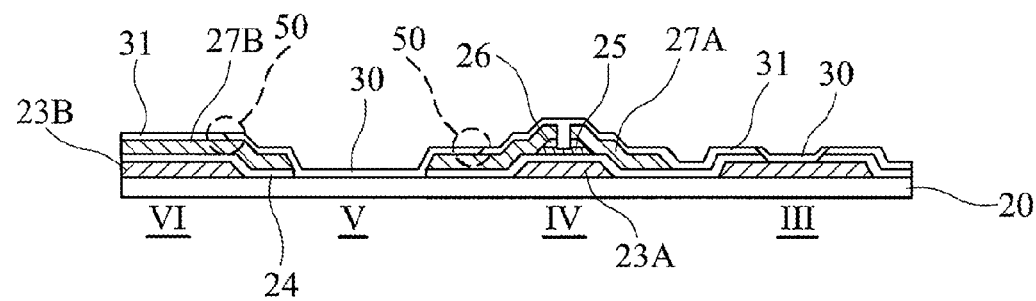

As shown in FIG. 4D, the photoresist layer 32 is removed by wet development or dry ashing to form the array substrate. Compared to the previous embodiment (FIG. 2E), this embodiment, utilizing the inorganic passivation layer 31 with the photoresist layer 32, needs an extra process to strip the photoresist layer 32. The inorganic passivation layer 31 adjoins the conductive layer 30 to provide a substantially continuous surface (as shown by dotted line circle 50), while also reducing the thickness of the array substrate. In other words, the surface of the inorganic passivation layer 31 and the surface of the conductive layer 30 are substantially on the same level.

Figure 3H:
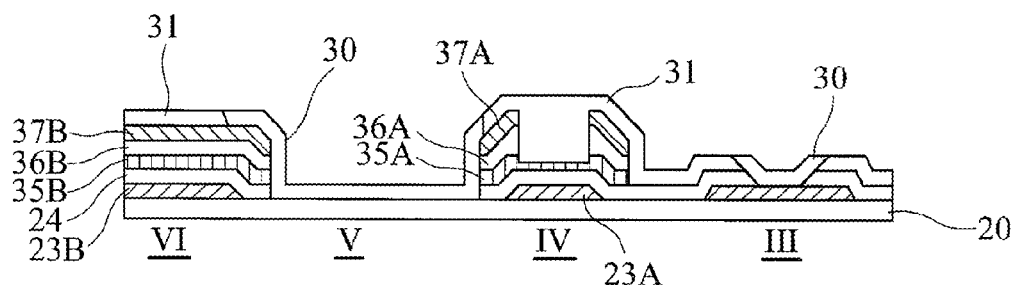

FIG. 3H shows a structure from processes of FIGS. 4A-4D following FIG. 3F. The laser ablation process and composition/fabrication method of the inorganic passivation layer 31 and the conductive layer 30 is omitted due to similar to FIGS. 4A-4D.

Figure 5A:
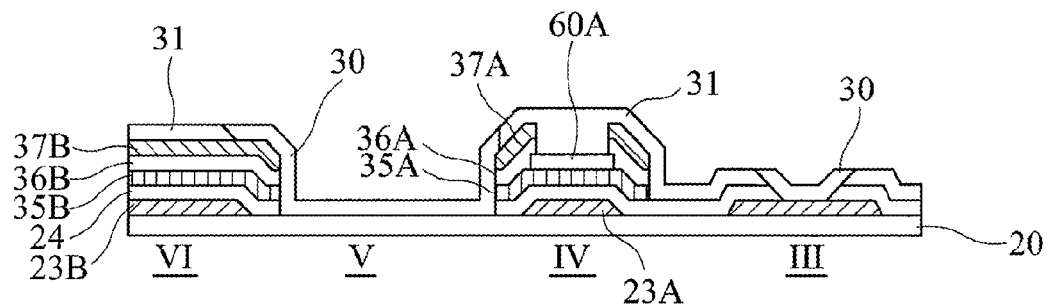
FIGS. 5A-5B are serial cross sectional views of the array substrate with an i-stopper in an embodiment of the present invention.
Figure 5B:
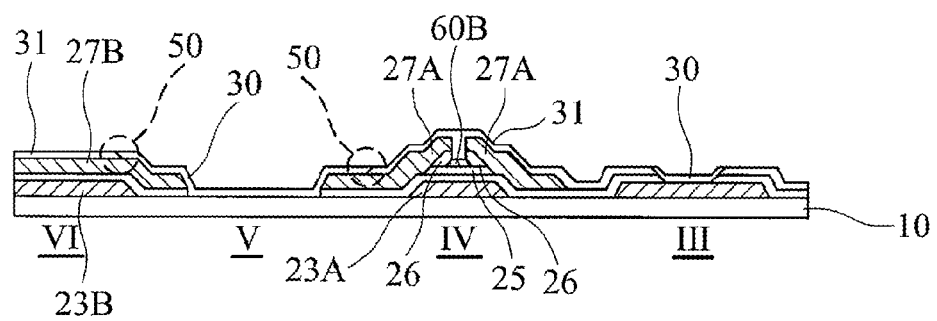

The bottom gate TFT IV of FIGS. 3H and 4D is formed by back channel etching, although it is understood that other process (such as i-stopper) or other type (such as top gate) may exist in the present invention. Compared to FIGS. 3H and 4D, the structures in FIGS. 5A and 5B also have substrate 20, contact pad III, TFT IV, pixel region V, and storage capacitor VI. The difference between FIGS. 5A and 3G is an etch stop layer 60A formed on the channel layer 35A before the ohmic contact layer 36 formed. The difference between FIGS. 5B and 4D is an etch stop layer 60B formed on the channel layer 25 before the ohmic contact layer 26 formed. Therefore, back etching will thus not dent the channel layers 25 and 35A, such that the electrical properties of the channel layers are protected.

Several array substrates of the embodiments of the present invention can be further applied in various display such as liquid crystal display (LCD), electro luminescent display, field emission display, carbon nanotube display, and the like, wherein the electro luminescent display includes organic (e.g. small molecule or polymer) or inorganic electro luminescent display, or likes. In additional, at least one of the array substrate and the display applied in the electro-optical apparatus such as mobile product (such as phone cell, video camera, notebook, play apparatus, watch, music player, receive and send to e-mail apparatus, map guider, digital camera, or likes), video-sound product (such as video-sound player, or likes), monitor, TV, billboard, signboard, or likes. Wherein the electro-optical apparatus further comprising electric device (not shown) is electrically connected to the display, such as control device, operate device, processing device, input device, memory device, driving device, luminous device, protecting device, or other function device, or combinations thereof.

The above-description is a detailed illustration for a variety of preferred embodiments of the present invention. The embodiments should not be construed as limiting the scope of the invention. Rather, it is intended to cover various modifications and similar arrangements included within the spirit and scope of the appended claims, the scope of which should be accorded the broadest interpretation so as to encompass all such modifications and similar structure.

What is claimed is:

1. A method for manufacturing an array substrate, comprising:
    forming a contact pad, a thin film transistor (TFT), a pixel region, and a storage capacitor on a substrate;
    forming an organic material layer on the contact pad, the TFT, the pixel region, and the storage capacitor;
    patterning the organic material layer to expose the pixel region, part of the contact pad, part of the TFT, and part of the storage capacitor;
    depositing a conductive layer on the exposed pixel region, exposed the part of the contact pad, exposed the part of the TFT, and exposed the part of the storage capacitor; and
    performing a laser ablation process to remove the conductive layer on the organic material layer and remain the conductive layer on the pixel region, on the part of the contact pad, on the part of the TFT, and on the part of the storage capacitor.

2. The method of claim 1, wherein the conductive layer comprises transparent conductive materials, opaque conductive materials, or combinations thereof.

3. The method of claim 1, wherein the laser ablation process has an energy density of about 10 mJ/cm$^2$ to about 500 mJ/cm$^2$.

4. The method of claim 1, wherein the laser ablation process has a wavelength of about 150 nm to about 400 nm.

5. The method of claim 1, wherein the exposed pixel region, the exposed the part of the contact pad, the exposed the part of the TFT, and the exposed the part of the storage capacitor comprise flexible materials, inorganic materials, metals, alloys, or combinations thereof.

6. The method of claim 1, wherein the organic material layer comprises a passivation layer.

7. The method of claim 6, wherein the passivation layer comprises positive photoresists or negative photoresists.

8. The method of claim 1, further comprising forming an inorganic passivation layer on the substrate before forming the organic material layer, wherein the organic material layer is a photoresist layer.

9. The method of claim 8, further comprising performing a stripping process to remove the photoresist layer after the laser ablation process.

10. The method of claim 8, wherein the inorganic passivation layer comprises a silicon nitride, silicon oxide, silicon oxynitride, silicon carbide, or combinations thereof.

11. The method of claim 1, wherein formation of the contact pad, the TFT, the pixel region, and the storage capacitor on the substrate comprises:
    forming a first metal layer on the substrate;
    patterning the first metal layer to expose the substrate in the pixel region and to form the contact pad, a gate electrode of the TFT, and a bottom electrode of the storage capacitor;
    forming a dielectric layer on the exposed the substrate in the pixel region, on the contact pad, on the gate electrode, and on the bottom electrode;
    forming a channel layer and an ohmic contact layer on the gate electrode of the TFT;
    forming a second metal layer on the substrate;
    patterning the second metal layer to form source/drain electrodes of the TFT and a top electrode of the storage capacitor;
    removing part of the ohmic contact layer not covered by the source/drain electrodes to expose the part of the channel layer.

12. The method of claim 11, further comprising forming an etch stop layer between the channel layer and the ohmic contact layer.

13. The method of claim 1, wherein formation of the contact pad, the TFT, the pixel region, and the storage capacitor on the substrate comprises:
    forming a first metal layer on the substrate;
    patterning the first metal layer to expose the substrate in the pixel region and to form the contact pad, a gate electrode of the TFT, and a bottom electrode of the storage capacitor;
    forming a dielectric layer, a channel layer, an ohmic contact layer, a second metal layer, and a photoresist layer on the contact pad, on the gate electrode, and on the bottom electrode;
    patterning the photoresist layer to form a thin photoresist region and a thick photoresist region, so that the thin photoresist region substantially aligns with the gate electrode, and the thick photoresist region substantially aligns with the bottom electrode and two sides of the gate electrode;
    removing the part of the second metal layer not covered by the thin photoresist region and the thick photoresist region;
    removing the thin photoresist region;
    removing the part of the second metal layer and part of the ohmic contact layer on the gate electrode to expose part of the channel layer, and removing the ohmic contact layer and the channel layer not covered by the thick photoresist region, wherein the un-removed part of the second metal layer acts as source/drain electrodes of the TFT and a top electrode of the storage capacitor; and
    removing the thick photoresist region.

14. The method of claim 13, further comprising forming an etch stop layer between the channel layer and the ohmic contact layer.

15. The method of claim 1, wherein formation of the contact pad, the TFT, the pixel region, and the storage capacitor on the substrate comprises:
    forming a first metal layer on the substrate;

patterning the first metal layer to expose the substrate in the pixel region and to form the contact pad, a gate electrode of the TFT, and a bottom electrode of the storage capacitor;

forming a dielectric layer, a channel layer, an ohmic contact layer, a second metal layer, and a photoresist layer on the contact pad, on the gate electrode, and on the bottom electrode;

patterning the photoresist layer to form a thin photoresist region and a thick photoresist region, so that the thin photoresist region substantially aligns with the gate electrode, and the thick photoresist region substantially aligns with the bottom electrode and two sides of the gate electrode;

removing the part of the second metal layer, the part of the ohmic contact layer, and the part of the channel layer not covered by the thin photoresist region and the thick photoresist region to expose part of the dielectric layer;

removing the thin photoresist region;

removing the part of the second metal layer and the part of the ohmic contact layer on the gate electrode to expose the part of the channel layer, wherein the un-removed the part of the second metal layer acts as source/drain electrodes of the TFT and a top electrode of the storage capacitor; and removing the thick photoresist region.

16. The method of claim 15, further comprising forming an etch stop layer between the channel layer and the ohmic contact layer.

* * * * *